(12) United States Patent
Lee et al.

(10) Patent No.: US 12,270,832 B2
(45) Date of Patent: Apr. 8, 2025

(54) DEVICE AND METHOD FOR DIAGNOSING FAILURE OF INVERTER INITIAL CHARGING CIRCUIT

(71) Applicant: LS ELECTRIC CO., LTD., Anyang-si (KR)

(72) Inventors: Jae Moon Lee, Anyang-si (KR); Tae Suk Bae, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 67 days.

(21) Appl. No.: 17/801,413

(22) PCT Filed: Jan. 7, 2021

(86) PCT No.: PCT/KR2021/000189
§ 371 (c)(1),
(2) Date: Aug. 22, 2022

(87) PCT Pub. No.: WO2021/172736
PCT Pub. Date: Sep. 2, 2021

(65) Prior Publication Data
US 2023/0078868 A1 Mar. 16, 2023

(30) Foreign Application Priority Data
Feb. 24, 2020 (KR) .................. 10-2020-0022386

(51) Int. Cl.
*G01R 1/20* (2006.01)
*G01R 31/327* (2006.01)

(52) U.S. Cl.
CPC ......... *G01R 1/203* (2013.01); *G01R 31/3278* (2013.01)

(58) Field of Classification Search
None
See application file for complete search history.

(56) References Cited

U.S. PATENT DOCUMENTS 6,084,785 A * 7/2000 Kunisada ............... H02M 1/32
363/40
6,760,942 B2 * 7/2004 Lee ......................... D06F 34/08
68/12.04

(Continued)

FOREIGN PATENT DOCUMENTS

CN 109342935 A 2/2019
JP H07023523 A 1/1995

(Continued)

OTHER PUBLICATIONS

Jung Do Yang et al.; Detecting Method of Relay State for Battery Apparatus; Date Published Oct. 31, 2007; LG Chemical Ltd [KR]; KR 20070105556 A; (Year: 2007).*

(Continued)

*Primary Examiner* — Nasima Monsur
(74) *Attorney, Agent, or Firm* — K&L Gates LLP

(57) ABSTRACT

A device and a method for diagnosing a failure of an inverter initial charging circuit are provided. The device for diagnosing a failure of an initial charging circuit is advantageous as follows: it is possible to detect whether a relay of the initial charging circuit is malfunctioning or not by using a photocoupler connected in parallel with an initial charging resistor of the initial charging circuit, on the basis that, if a current flows through the initial charging resistor in a relay-on state, the photocoupler is turned on; and it is possible to prevent component failure or burnout from occurring due to a high current flowing through the initial charging resistor in the case of a relay failure.

3 Claims, 8 Drawing Sheets

(56) References Cited

U.S. PATENT DOCUMENTS

| | | | |
|---|---|---|---|
| 2008/0259659 A1* | 10/2008 | Choi | H02M 1/32 |
| | | | 363/50 |
| 2009/0168470 A1 | 7/2009 | Chen | |
| 2015/0035539 A1* | 2/2015 | Wakida | G01R 31/327 |
| | | | 324/418 |
| 2017/0310208 A1* | 10/2017 | Bae | H02H 9/004 |
| 2017/0317487 A1 | 11/2017 | Kim | |
| 2017/0373630 A1* | 12/2017 | Figie | H02P 29/024 |

FOREIGN PATENT DOCUMENTS

| | | | |
|---|---|---|---|
| JP | 2003174778 A | 6/2003 | |
| JP | 2012120376 A | 6/2012 | |
| KR | 1020060090127 A | 8/2006 | |
| KR | 1020170122057 A | 11/2017 | |
| KR | 1020180101752 A | 9/2018 | |

OTHER PUBLICATIONS

International Search Report for related International Application No. PCT/KR2021/000189; action dated Sep. 2, 2021; (5 pages).
Written Opinion for related International Application No. PCT/KR2021/000189; action dated Sep. 2, 2021; (5 pages).
Supplementary Search Report for related European Application No. 21761792.7; action dated Mar. 13, 2024; (41 pages).

* cited by examiner

DEVICE AND METHOD FOR DIAGNOSING FAILURE OF INVERTER INITIAL CHARGING CIRCUIT

CROSS-REFERENCE TO RELATED APPLICATION

The present application is a National Stage of International Application No. PCT/KR2021/000189 filed on Jan. 7, 2021, which claims priority to and the benefit of Korean Utility Model Application No. 10-2020-0022386, filed on Feb. 24, 2020, the disclosure of which is incorporated herein by reference in its entirety.

FIELD

The present disclosure relates to an inverter, and more particularly to an initial charging circuit of an inverter.

BACKGROUND

The inverter is one of the representative power conversion devices along with the converter. The inverter receives AC power, converts it to DC and then converts it back to AC for controlling an electric motor to control the electric motor. It is used in various forms throughout the industry where electric motors are used, such as fans, pumps, elevators, transfer devices, production lines and the like. The converter is a device that converts AC or DC input power into DC, and the power conversion method is similar to that of an inverter, and similar to an inverter, it is used variously throughout the industry.

An initial charging circuit is essential for an inverter. The initial charging circuit prevents an overcurrent from flowing in the DC link capacitor of the inverter due to the inrush current, and protects the devices from the parasitic inductance components of a rectifier and a DC terminal and the high voltage generated by the inrush current.

FIG. 1 shows the structure of a general inverter according to prior art.

The rectifier 10 converts three-phase AC power into DC power to charge the DC link capacitor 30, and the DC power stored in the DC link capacitor 30 is again converted into AC power by the inverter 40 and transmitted to the electric motor.

In order to prevent an overcurrent from flowing in the DC link capacitor 30 due to the inrush current, an initial charging circuit 20 is required, and the initial charging circuit 20 includes an initial charging resistor and a relay.

FIG. 2 shows the flow of current during initial charging and inverter operation.

At the time of initial charging, since the relay of the initial charging circuit 20 is in an off state, the output current of the rectifier 10 flows to the DC link capacitor 30 through the initial charging resistor of the initial charging circuit 20. When the initial charging is finished, the relay is turned on and the output current of the rectifier 10 flows to the DC link capacitor 30 and the inductor 40 through the relay of the initial charging circuit 20.

FIG. 3 shows the voltage applied to the DC link capacitor according to time.

When the DSP reset is canceled and the voltage of the DC link capacitor is higher than the low voltage clear (LV Clear) level, the relay of the initial charging circuit is on (Relay On), and after the ready point, a voltage 32 that does not pass through the initial charging resistor of the initial charging circuit is applied to the DC link capacitor as shown in the solid line. If the relay is not turned on and continues through the initial charging resistor, the voltage 34 applied to the DC link capacitor will appear as a dotted line due to the voltage drop due to the initial charging resistor.

However, when a light load is applied to the inverter even when the relay is in an on state, a voltage drop may occur, and on/off of the relay cannot be distinguished simply by the voltage drop. Therefore, there is a problem in that it is impossible to determine whether the relay included in the initial charging circuit is faulty by the voltage drop of the DC link capacitor.

The inventors of the present disclosure have been researching and trying to solve the problems of the method for diagnosing a failure of an initial charging circuit of prior art. The present disclosure was completed after much effort to complete a device and method capable of effectively diagnosing the failure of an initial charging circuit while minimizing the addition of components for diagnosing the failure of an initial charging circuit.

SUMMARY

It is an object of the present disclosure to provide a device and method capable of effectively diagnosing a failure of a relay while minimizing additional components.

It is another object of the present disclosure to prevent power loss due to an initial charging resistor or component failure or burnout by diagnosing a failure of a relay by adding simple components.

Meanwhile, other objects not specified in the present disclosure will be additionally considered within the range that can be easily inferred from the following detailed description and effects thereof.

The device for diagnosing a failure of an inverter initial charging circuit according to the present disclosure includes a relay malfunction detector including a photocoupler having an input side connected in parallel to an initial charging resistor of the inverter initial charging circuit: a voltage detector including a first resistor connected in parallel with an output side of the photocoupler; and a controller for determining whether a relay malfunctions by an output voltage which is output from the first resistor of the voltage detector.

The photocoupler of the relay malfunction detector is turned on when a current flows through the initial charging resistor.

The voltage detector further includes a second resistor, the first resistor and the second resistor are connected in series, and the first resistor and the second resistor connected in series are preferably connected in parallel with a DC link capacitor of an inverter.

The controller determines that the initial charging circuit is faulty when the output voltage of the first resistor becomes 0 after the initial charging of an inverter is completed and a run command is provided.

The method for diagnosing a failure of an inverter initial charging circuit according to another exemplary embodiment of the present disclosure includes the steps of turning on a relay after the initial charging of an inverter is completed: starting operation of the inverter: detecting a voltage drop of a DC link capacitor: determining whether a photocoupler connected in parallel with an initial charging resistor of the inverter initial charging circuit is turned on/off; and determining that a relay of the initial charging circuit is malfunctioning when the photocoupler is in an on state.

The step of determining whether the photocoupler is turned on/off is determining by measuring the voltage of a resistor connected in parallel with an output side of the photocoupler.

According to the present disclosure, there is an effect of effectively detecting the failure of an initial charging circuit by adding a photocoupler that does not use a separate power source or controller.

In addition, since the voltage detection method using the conventional OPAMP is not used, there is an advantage in that the cost can be reduced.

Meanwhile, even if it is an effect not explicitly mentioned herein, it is added that the effects described in the following specification expected by the technical features of the present disclosure and their potential effects are treated as described in the specification of the present disclosure.

※ It is revealed that the accompanying drawings are exemplified as a reference for understanding the technical idea of the present disclosure, and the scope of the present disclosure is not limited thereby.

DETAILED DESCRIPTION

Hereinafter, the configuration of the present disclosure guided by various exemplary embodiments of the present disclosure and the effects resulting from the configuration will be described with reference to the drawings. In the description of the present disclosure, if it is determined that matters that are obvious to those skilled in the art may unnecessary obscure the gist of the present disclosure with respect to related known functions, the detailed description thereof will be omitted.

Terms such as 'first' and 'second' may be used to describe various components, but the components should not be limited by the above terms. The above term may be used only for the purpose of distinguishing one component from another. For example, without departing from the scope of the present disclosure, a 'first component' may be termed a 'second component', and similarly, a 'second component' may also be termed a 'first component'. In addition, the singular expression includes the plural expression unless the context clearly dictates otherwise. Unless otherwise defined, terms used in the exemplary embodiments of the present disclosure may be interpreted as meanings commonly known to those of ordinary skill in the art.

Hereinafter, the configuration of the present disclosure guided by various exemplary embodiments of the present disclosure and the effects resulting from the configuration will be described with reference to the drawings.

Figure 1:
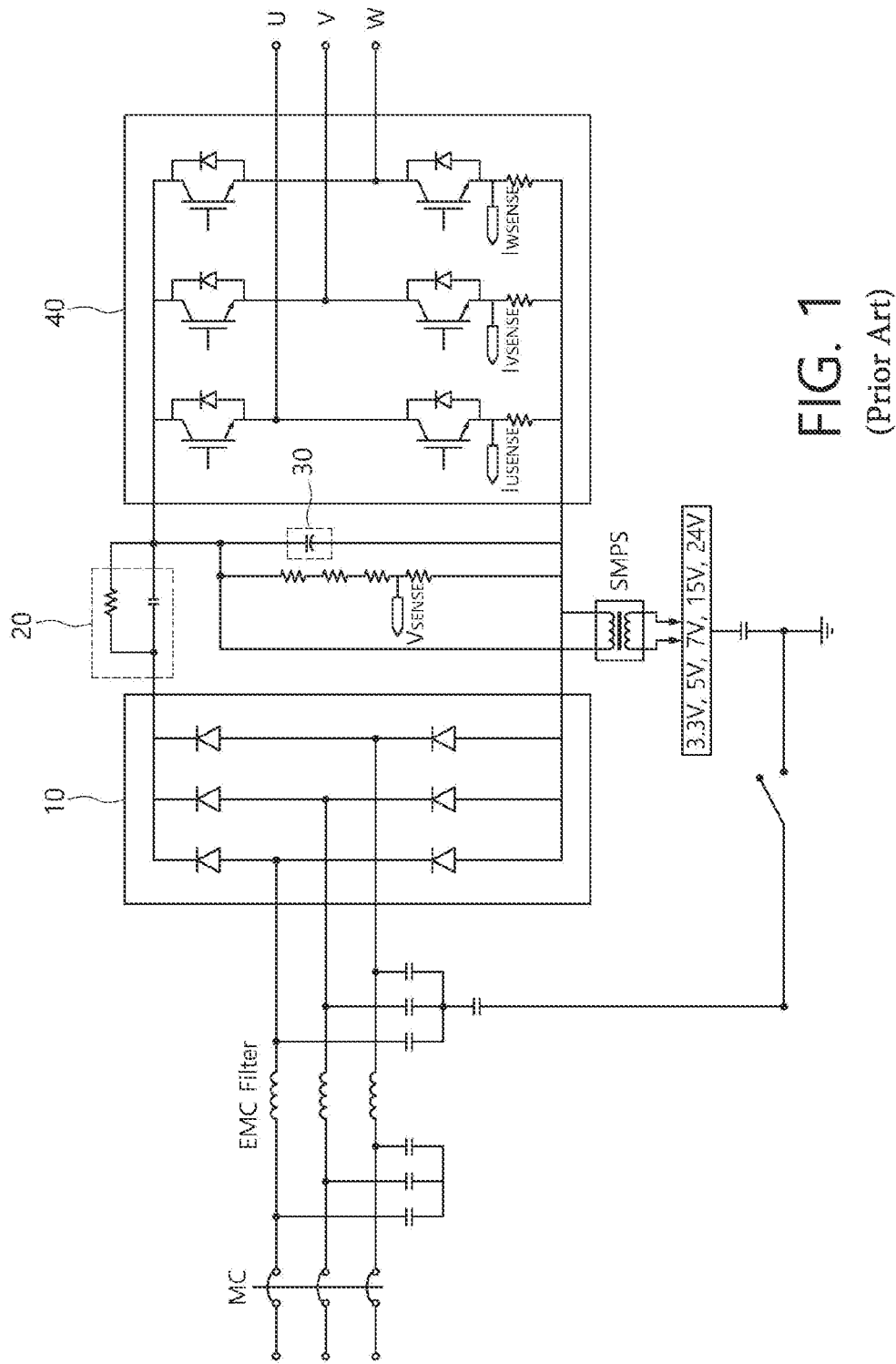
FIG. 1 is a structural diagram of a general inverter of prior art.
Figure 2:
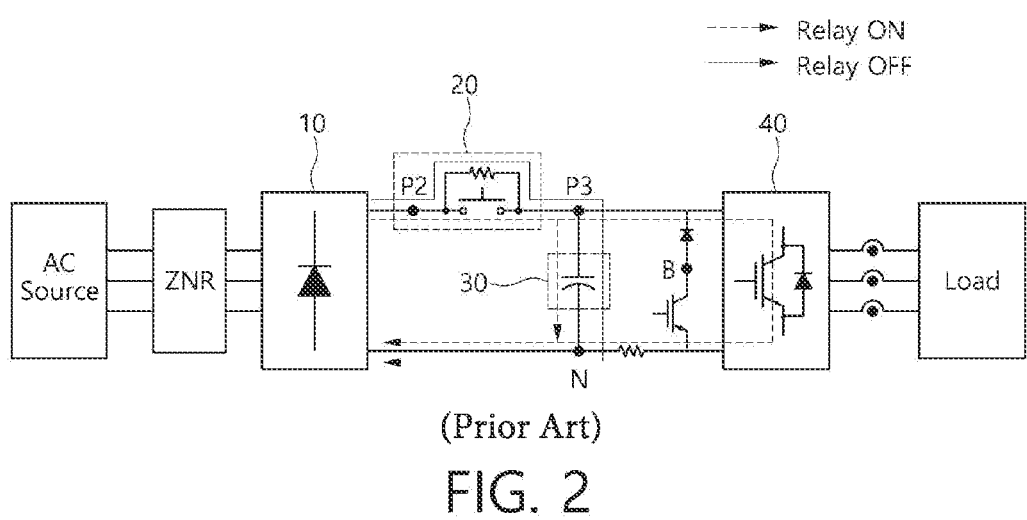
FIG. 2 shows the flow of current according to the relay on/off in the inverter of prior art.
Figure 3:
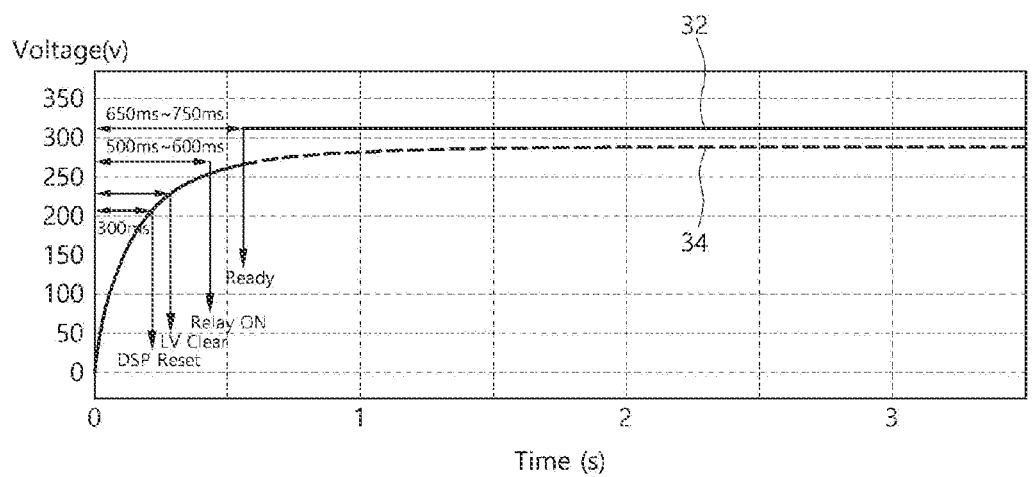
FIG. 3 shows the level at which the voltage is charged in the DC link capacitor of prior art.
Figure 4:
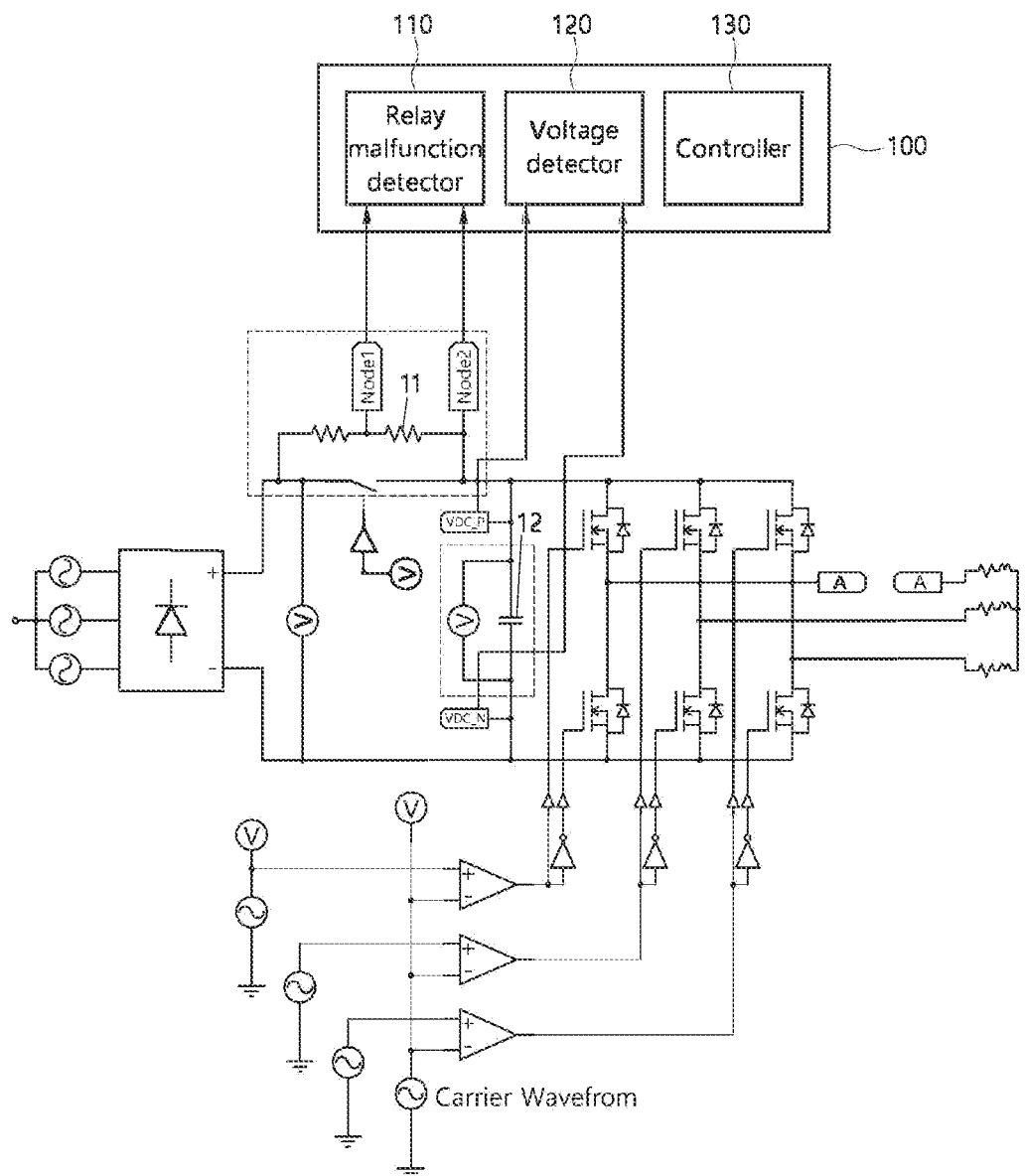
FIG. 4 is a structural diagram of the device for diagnosing a failure of an inverter initial charging circuit according to a preferred exemplary embodiment of the present disclosure.

FIG. 4 is a structural diagram of the device for diagnosing a failure of an initial charging circuit 100 according to a preferred exemplary embodiment of the present disclosure.

The device for diagnosing a failure of an initial charging circuit 100 includes a relay malfunction detector 110, a voltage detector 120 and a controller 130.

The relay malfunction detector 110 is connected in parallel with an initial charging resistor 11 of an initial charging circuit to detect a relay malfunction.

The voltage detector 120 is connected in parallel with a DC link capacitor 12 to detect the voltage of a DC link capacitor 12 and a voltage for determining a relay malfunction.

The controller 130 includes one or more processors, and determines a malfunction of the relay based on the voltage detected by the relay voltage detector 120.

Figure 5:
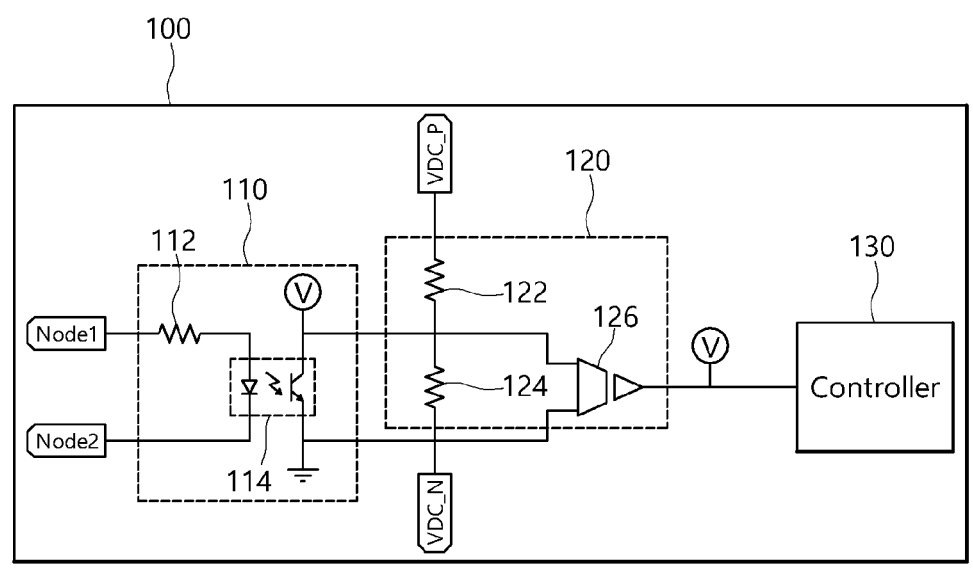
FIG. 5 is a more detailed structural diagram of the device for diagnosing a failure of an inverter initial charging circuit according to the present disclosure.

FIG. 5 is a more detailed structural diagram of the device for diagnosing a failure of an initial charging circuit 100 according to the present disclosure.

The relay malfunction detector 110 includes an input resistor 112 and a photocoupler 114. The input resistor 112 is connected in series to an input side of the photocoupler 114.

The voltage detector 120 includes a first resistor 124, a second resistor 122 and a voltage measuring device 126. The first resistor 124 and the second resistor 122 are connected in series, and the first resistor 124 and the second resistor 122 connected in series are connected to the DC link capacitor 12 in parallel. The first resistor 124 is connected in parallel to an output of the photocoupler 114 of the relay malfunction detector 110.

In the initial charging circuit, when the inverter is in the run state after the initial charging is completed, the relay is turned on, and thus, no current flows through the initial charging resistor 11. Then, a current does not flow even in the photocoupler 114 of the relay malfunction detector 110 such that the photocoupler 114 is in an open state. When the photocoupler 114 is in an open state, the voltage measuring device 126 measures the voltage applied to the first resistor 124, and since the first resistor 124 and the second resistor 122 are connected in series, the voltage across the DC link capacitor 12 is divided according to the ratio of the resistance. For example, if the voltage applied to the DC link capacitor 12 is 330V, the first resistor 124 is 20 kiloohm, and the second resistor 122 is 200 kiloohm, since only 1/10 of the voltage applied to the second resistor 122 is applied to the first resistor 124, a voltage of 30V is applied to the first resistor 124 and a voltage of 300V is applied to the second resistor 122. Therefore, a voltage of 30V will be measured in the voltage measuring device 126.

On the other hand, if the relay of the initial charging circuit is not in an on state even though the inverter is in an operating state after the initial charging is completed, it may be determined that the relay is malfunctioning. When the relay is in an off state, a current flows through the initial charging resistor 11, not the relay. When a current flows through the initial charging resistor 11, a current also flows through a photodiode 114 connected in parallel, and the photodiode 114 is turned on.

When the photodiode 114 is turned on, both ends of the photodiode 114 are short-circuited, and thus, both ends of the first resistor 124 of the voltage detector 120 are also short-circuited. Therefore, a voltage of 0 will be measured in the voltage measuring device 126 for measuring the voltage across the first resistor 124. In this case, the voltage across the DC link capacitor 12 will appear to be lower than in the normal case due to the voltage dropped by the initial charging resistor 11.

If the voltage across the DC link capacitor 12 appears to be lower than normal and the voltage measured by the voltage measuring device 126 is lower than a reference value, the controller 130 may determine that the relay of the initial charging circuit is faulty. Even if the voltage across the DC link capacitor 12 appears to be lower than normal, if the value measured by the voltage measuring device 126 is higher than the reference value, it may be determined that this is not a relay failure but a light load operation of the inverter.

Figure 6:
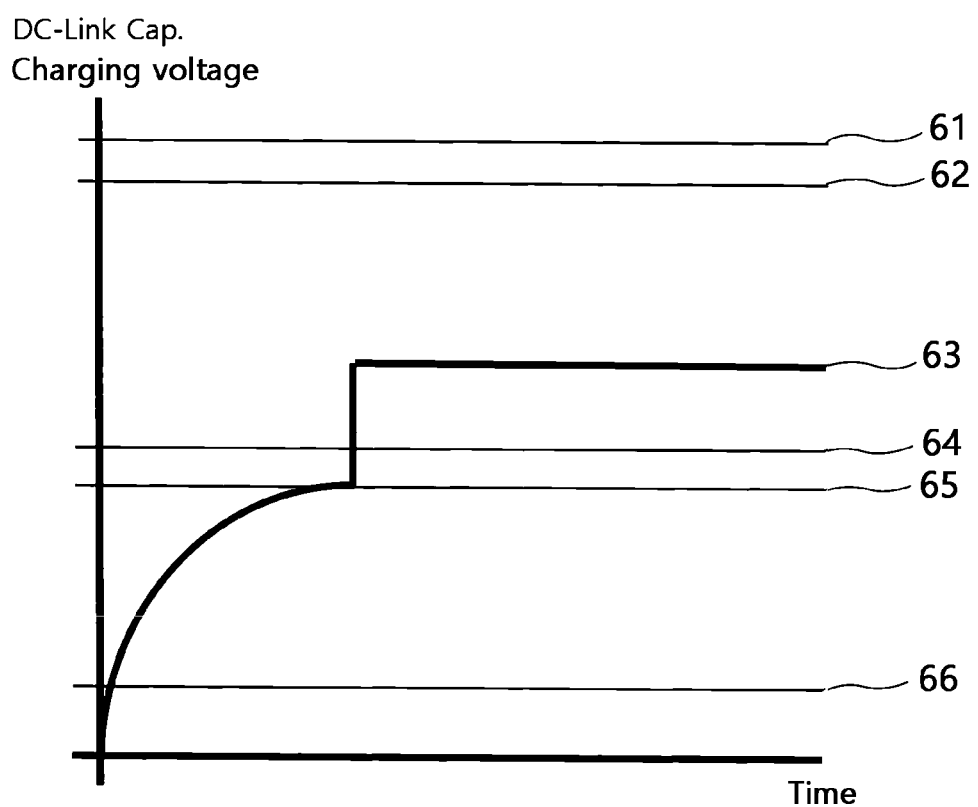
FIG. 6 shows voltage levels for each operation of the DC link capacitor.

FIG. 6 shows the reference voltage of a DC link capacitor 12 for determining the failure of an initial charging circuit in a controller as described above.

The SMPS for the operation of the entire inverter is always operated at a very small voltage 66 or higher.

The operating voltage of the inverter is maintained between the overvoltage level 61 and the low voltage level 65 at which the relay is turned on after the initial charging is completed. Preferably, the rated voltage should be maintained between the rated maximum voltage 62 and the rated minimum voltage 64. In the relay on state, since there is no voltage drop due to the initial charging resistor 11, the DC link capacitor 12 maintains a constant charging voltage 63, but in special circumstances such as a relay failure or light load operation, it may fall below the charging voltage 63. In this case, by the relay malfunction detector 110 and the voltage detector 120, the controller may determine whether the voltage drop is a normal voltage drop or a voltage drop caused by a relay malfunction.

Figure 7:
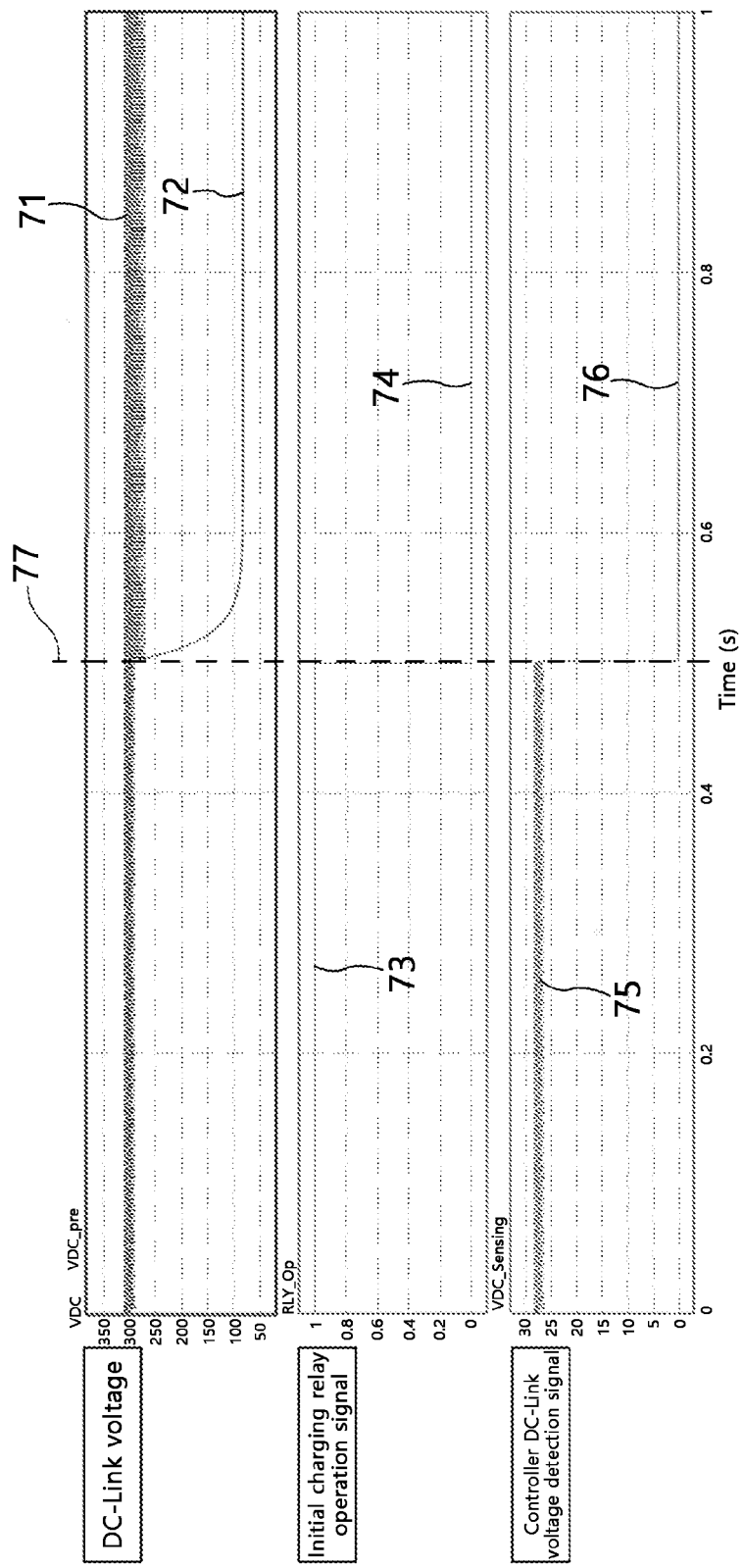
FIG. 7 shows examples of signals detected according to the present disclosure.

FIG. 7 shows examples of signals detected when a relay malfunctions.

A change in the signal appears at a time point 77 when the relay malfunction starts.

The DC link voltage represents a voltage 71 measured before the initial charging circuit and a voltage 72 measured from the DC link capacitor 12. If the relay malfunctions, the ripple occurs in the voltage measured before the initial charging circuit because the output current of the rectifier passes through the initial charging resistor 11. In addition, the voltage 72 applied to the DC link capacitor 12 is dropped due to the initial charging resistor 11.

The relay malfunctions and is switched from an on state 73 to an off state 74.

When the photocoupler 114 is turned on when the relay malfunctions, the voltage 76 detected by the voltage detector 120 drops to zero.

Figure 8:
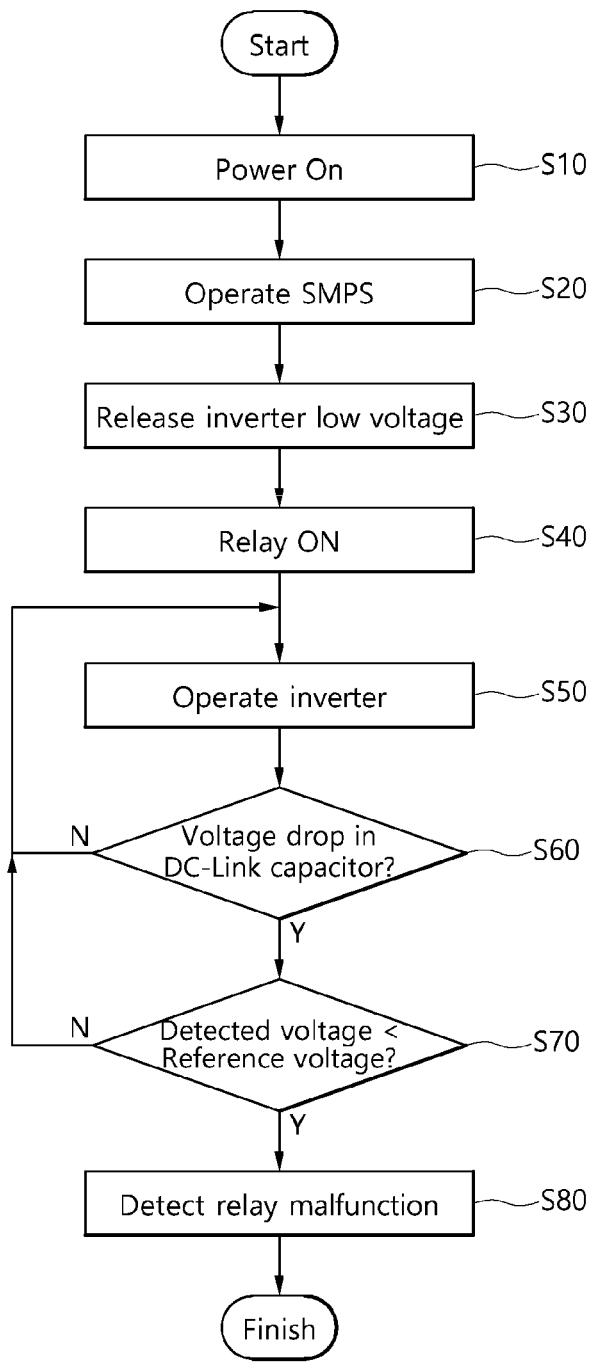
FIG. 8 is a flowchart of the method for diagnosing a failure of an inverter initial charging circuit according to another preferred exemplary embodiment of the present disclosure.

FIG. 8 is a flowchart of the method for diagnosing a failure of an inverter initial charging circuit according to another preferred exemplary embodiment of the present disclosure.

When the power of the inverter is turned on (S10) and the SMPS for overall control of the inverter operates (S20), initial charging starts.

When the voltage charged in the DC link capacitor 12 reaches an inverter low voltage clear (LV Clear) level (S30), when the initial charging is finished and the relay of the initial charging circuit is switched on (S40), the inverter starts to operate (Run) (S50).

The controller determines whether a voltage drop of the DC link capacitor 12 has occurred (S60), and determines whether the voltage drop is due to a failure of the relay or a normal low voltage operation.

To this end, the controller determines the state of the photocoupler connected in parallel to the initial charging resistor 11, and the state of the photocoupler is determined by the voltage applied to the resistor connected in parallel with the output side of the photocoupler. When the photocoupler is in an on state, the voltage of the resistors connected in parallel becomes 0 when the photocoupler is in an on state, and when the photocoupler is in an off state, the voltage of the resistors connected in parallel becomes 0.

Therefore, it is determined whether the voltage detected at the resistor connected in parallel with the photocoupler is below a reference voltage (S70), and if it is below the reference voltage, it is determined that the relay is malfunctioning (S80), and it may display a warning message or stop the operation of the inverter.

According to the present disclosure as described above, there is an effect of effectively determining whether the relay of the initial charging circuit is faulty by the photocoupler, which does not require a separate power source or controller.

The protection scope of the present disclosure is not limited to the description and expression of the exemplary embodiments explicitly described above. In addition, it is added once again that the protection scope of the present disclosure cannot be limited due to obvious changes or substitutions in the technical field to which the present disclosure pertains.

The invention claimed is:

1. A device for diagnosing a failure of an inverter initial charging circuit, comprising:
   a relay malfunction detector comprising a photocoupler having an input side connected in parallel to an initial charging resistor of the inverter initial charging circuit to detect a malfunction of a relay, wherein the inverter initial charging circuit includes the initial charging resistor and the relay;
   a voltage detector comprising a first resistor connected in parallel with an output side of the photocoupler, a second resistor connected in series with the first resistor and a voltage measuring device measuring an output voltage applied to the first resistor and a voltage applied to a DC link capacitor, wherein the first resistor and the second resistor connected in series are connected in parallel with the DC link capacitor of an inverter, and wherein the output voltage is determined according to a ratio of resistances of the first resistor and the second resistor and to the voltage applied to the DC link capacitor; and
   a controller configured to determine whether the relay malfunctions by the output voltage and the voltage applied to the DC link capacitor, wherein the controller determines that the relay has malfunctioned when the voltage applied to the DC link capacitor has been dropped and the output voltage becomes 0 after an initial charging of the inverter is completed and the inverter starts to operate.

2. The device of claim 1, wherein the photocoupler of the relay malfunction detector is turned on when a current flows through the initial charging resistor.

3. A method for diagnosing a failure of an inverter initial charging circuit, which is performed by a controller comprising one or more processors, the method comprising the steps of:
   turning on a relay after the initial charging of an inverter is completed;
   starting operation of the inverter;

detecting a voltage drop of a DC link capacitor;
determining whether a photocoupler connected in parallel with an initial charging resistor of the inverter initial charging circuit is turned on/off,
wherein the inverter initial charging circuit includes the initial charging resistor and the relay; and
determining whether the relay of the initial charging circuit is malfunctioning based on an output voltage of a first resistor and a voltage applied to the DC link capacitor when the photocoupler is in an on state,
wherein the step of determining whether the photocoupler is turned on/off is determined by measuring the output voltage of the first resistor connected in parallel with an output side of the photocoupler and determining that the relay malfunctions when the voltage applied to the DC link capacitor has been dropped and the output voltage becomes 0, after the initial charging of the inverter is completed and the inverter starts to operate,
wherein the first resistor and a second resistor are connected in series with one another and in parallel to the DC link capacitor,
wherein the output voltage is determined according to a ratio of resistances of the first resistor and the second resistor and the voltage applied to the DC link capacitor.

* * * * *